(12) United States Patent
Wilson (10) Patent No.: US 10,531,213 B2
(45) Date of Patent: Jan. 7, 2020

(54) MEMS TRANSDUCER SYSTEM

(71) Applicant: Cirrus Logic International Semiconductor Ltd., Edinburgh (GB)

(72) Inventor: Paul Wilson, Linlithgow (GB)

(73) Assignee: Cirrus Logic, Inc., Austin, TX (US)

( * ) Notice: Subject to any disclaimer, the term of this patent is extended or adjusted under 35 U.S.C. 154(b) by 37 days.

(21) Appl. No.: 15/939,836

(22) Filed: Mar. 29, 2018

(65) Prior Publication Data

US 2019/0306641 A1 Oct. 3, 2019

(51) Int. Cl.
*H04R 29/00* (2006.01)
*B81B 7/00* (2006.01)
*H04R 19/04* (2006.01)
*G01R 23/09* (2006.01)

(52) U.S. Cl.
CPC ........... *H04R 29/004* (2013.01); *B81B 7/008* (2013.01); *G01R 23/09* (2013.01); *H04R 19/04* (2013.01); *B81B 2201/0257* (2013.01); *B81B 2207/03* (2013.01); *H04R 2201/003* (2013.01)

(58) Field of Classification Search
CPC .... H04R 29/004; H04R 19/04; H04R 19/005; H04R 3/00; H04R 2201/003; G01R 27/2605; G01R 31/3187; G01R 23/09; B81B 7/008; B81B 2207/03; B81B 2201/0257

See application file for complete search history.

(56) References Cited

U.S. PATENT DOCUMENTS

| | | | |
|---|---|---|---|
| 2016/0202286 A1* | 7/2016 | Aaltonen | G01P 15/125 73/1.38 |
| 2016/0305835 A1* | 10/2016 | Kollias | G01L 9/12 |
| 2019/0212358 A1* | 7/2019 | Oshima | G01P 15/0802 |

\* cited by examiner

*Primary Examiner* — Yogeshkumar Patel
(74) *Attorney, Agent, or Firm* — Jackson Walker L.L.P.

(57) ABSTRACT

The present disclosure relates to a system comprising: a MEMS capacitive transducer comprising a first electrode and a second electrode; integrator circuitry; and test circuitry. The MEMS capacitive transducer forms part of a negative feedback path of the integrator circuitry, and the test circuitry is operable to selectively apply one or more current sources to an input of the integrator circuitry based on a signal at an output of the integrator so as to generate a periodic signal at the output of the integrator circuitry. A frequency of the periodic signal is at least partially dependent upon a capacitance of the MEMS capacitive transducer. The system is further operative to determine a parameter indicative of the frequency of the periodic signal and to estimate the capacitance of the MEMS capacitive transducer based on the parameter indicative of the frequency of the periodic signal.

20 Claims, 6 Drawing Sheets

MEMS TRANSDUCER SYSTEM

FIELD OF THE INVENTION

The present disclosure relates to the field of MEMS transducers and associated circuitry, and in particular to apparatus and methods for estimating the quiescent capacitance of such transducers.

BACKGROUND

Consumer electronics devices are continually getting smaller and, with advances in technology, are gaining ever-increasing performance and functionality. This is clearly evident in the technology used in consumer electronic products such as mobile phones, laptop computers, MP3 players and tablets. Requirements of the mobile phone industry, for example, are driving the components to become smaller with higher functionality and reduced cost. It is therefore desirable to integrate functions of electronic circuits together and combine them with transducer devices such as microphones and speakers.

The result of this is the emergence of micro-electrical-mechanical-systems (MEMS) based transducer devices. These may be, for example, capacitive transducers for detecting and/or generating pressure/sound waves or transducers for detecting acceleration. MEMS capacitive microphones typically comprise a first electrode, which is moveable with respect to a second fixed electrode in response to incident acoustic waves. The first electrode may, for example, be supported by a flexible membrane. By measuring changes in the capacitance between the electrodes, the incident acoustic signals can be detected. In use the electrodes of the MEMS microphone may be biased by biasing circuitry and the measurement signal may be amplified by amplifier circuitry such as a low-noise amplifier. MEMS transducers may also be designed to operate in the reverse mode of operation, in which electrical signals are applied to one or both of the electrodes to drive motion of the flexible membrane and so generate pressure/sound waves.

Although the process for manufacturing MEMS components has improved with the considerable research and development that has taken place in recent years, the uniformity of devices produced by such processes is still a significant issue for the industry. Inevitably, minor differences will exist between MEMS components even if they are manufactured by the same process. In the field of MEMS capacitive transducers, this can result in variation between the capacitance of individual components.

Further, it is known that the quiescent capacitance of a MEMS transducer (i.e. the capacitance when the transducer is not subject to incoming pressure waves, or driving input signals) may change over time, based on a number of factors such as the amount of use the transducer is subject to, the amplitude of signals used to drive the transducer, or the amplitude of pressure/sound waves detected by the transducer, and environmental conditions such as temperature and humidity.

As such, it is useful to be able to estimate the capacitance value of the MEMS transducer, following manufacture (e.g. using external test circuitry in the laboratory or manufacturing plant), during use (e.g. using test circuitry on-chip, within the same package in which the transducer is housed or, more generally, within the same host device in which the MEMS transducer is used) or both. The estimated capacitance value may be used to adjust the biasing voltage applied to the electrodes, or otherwise calibrate the input/output signals applied to or generated by the MEMS transducer so as to achieve a consistent performance from sample to sample or over time.

SUMMARY

According to a first aspect, the invention provides a system comprising: a MEMS capacitive transducer comprising a first electrode and a second electrode; integrator circuitry; and test circuitry, wherein the MEMS capacitive transducer forms part of a negative feedback path of the integrator circuitry, and wherein the test circuitry is operable to: selectively apply one or more current sources to an input of the integrator circuitry based on a signal at an output of the integrator so as to generate a periodic signal at the output of the integrator circuitry, wherein a frequency of the periodic signal is at least partially dependent upon a capacitance of the MEMS capacitive transducer; determine a parameter indicative of the frequency of the periodic signal; and estimate the capacitance of the MEMS capacitive transducer based on the parameter indicative of the frequency of the periodic signal.

The test circuitry may comprise comparator circuitry operable to compare a voltage of the periodic signal output by the integrator circuitry to an upper reference voltage and to a lower reference voltage, wherein the test circuitry is operable to selectively apply the one or more current sources to the input of the integrator circuitry based on the result of the comparison.

The comparator circuitry may comprise a Schmitt trigger, for example.

The integrator circuitry may comprise first operational amplifier circuitry.

The system may further comprise: a first capacitor coupled between an output of the integrator circuitry and the first electrode of the MEMS capacitive transducer such that the negative feedback path of the integrator circuitry contains a series combination of the first capacitor and the MEMS capacitive transducer.

The system may further comprise an AC follower in the negative feedback path of the integrator circuitry, the AC follower comprising: second operational amplifier circuitry having a first input coupled to the output of the integrator circuitry; a second capacitor coupled between the first electrode of the MEMS capacitive transducer and a second input of the second operational amplifier circuitry; and a resistor coupled between an output of the second operational amplifier circuitry and the second input of the second operational amplifier circuitry, wherein the first capacitor is coupled between the output of the second operational amplifier circuitry and the first electrode of the MEMS capacitive transducer.

The test circuitry may be operable to selectively apply the one or more current sources to the input of the integrator circuitry by alternately switching the one or more current sources between a pull-up configuration and a pull-down configuration.

The system may further comprise controller circuitry operable to adjust a bias voltage applied to the MEMS capacitive transducer based on the estimated capacitance of the MEMS capacitive transducer so as to achieve a given response of the MEMS capacitive transducer to acoustic inputs or driving voltages.

The parameter indicative of the frequency of the periodic signal may comprise the frequency of the periodic signal.

Alternatively, the parameter indicative of the frequency of the periodic signal may comprise a time period or part of the time period of the periodic signal.

The parameter indicative of the frequency of the periodic signal may alternatively comprise: a frequency of a signal output by the comparator circuitry; or a time period or part of the time period of the signal output by the comparator circuitry.

The system may be implemented on a single integrated circuit.

A second aspect of the invention provides a method for estimating a capacitance of a MEMS capacitive transducer comprising a first electrode and a second electrode, wherein the MEMS capacitive transducer forms part of a negative feedback path of integrator circuitry, the method comprising: selectively applying one or more current sources to an input of the integrator circuitry based on a signal at an output of the integrator circuitry so as to generate a periodic signal at the output of the integrator circuitry, wherein a frequency of the periodic signal is at least partially dependent upon a capacitance of the MEMS capacitive transducer; determining a parameter indicative of the frequency of the periodic signal; and estimating the capacitance of the MEMS capacitive transducer based on the parameter indicative of the frequency of the periodic signal.

The method may further comprise: comparing a voltage of the periodic signal at the output of the integrator circuitry to an upper reference voltage and to a lower reference voltage using comparator circuitry; selectively applying the one or more current sources to the input of the integrator circuitry based on the result of the comparison.

The method may further comprise selectively applying the one or more current sources to the input of the integrator circuitry by alternately switching the one or more current sources between a pull-up configuration and a pull-down configuration.

The method may further comprise adjusting a bias voltage applied to the MEMS capacitive transducer based on the estimated capacitance of the MEMS capacitive transducer so as to achieve a given response of the MEMS capacitive transducer to acoustic inputs or driving voltages.

The parameter indicative of the frequency of the periodic signal may comprise the frequency of the periodic signal.

Alternatively, the parameter indicative of the frequency of the periodic signal may comprises a time period or part of the time period of the periodic signal.

The parameter indicative of the frequency of the periodic signal may alternatively comprise: a frequency of a signal output by the comparator circuitry; or a time period or part of the time period of the signal output by the comparator circuitry.

The method may further comprise: for each of a plurality of different bias voltages: applying a selected bias voltage of the plurality of bias voltages to the first electrode of the MEMS capacitive transducer; and estimating the capacitance of the MEMS capacitive transducer when the selected bias voltage is applied; and estimating an elasticity of the MEMS capacitive transducer using the estimated capacitances for each of the plurality of different bias voltages based on an electromechanical model of the MEMS capacitive transducer.

A third aspect of the invention provides a MEMS transducer amplifier comprising: a first terminal for connection to a first electrode of a MEMS capacitive transducer; a second terminal for connection to a second electrode of the MEMS capacitive transducer; a first capacitor having a first electrode connected to the first terminal; an operational amplifier; a comparator; and one or more current sources, wherein the MEMS transducer amplifier is operable in a test mode in which: the second terminal is coupled to a first input of the operational amplifier; an output of the operational amplifier is coupled to a second electrode of the first capacitor and to an input of the comparator; and the second terminal is selectively coupled to the one or more current sources, based on a signal at an output of the comparator, so as to generate a periodic signal at the output of the operational amplifier.

A fourth aspect of the invention provides MEMS transducer test circuitry comprising: oscillator circuitry for generating a periodic signal indicative of a capacitance between first and second electrodes of a MEMS capacitive transducer, the oscillator circuitry comprising: integrator circuitry, wherein the first and second electrodes of the MEMS capacitive transducer can be connected to form part of a first negative feedback loop of the integrator circuitry; comparator circuitry for monitoring an output of the integrator circuitry; and one or more current sources selectively applicable, based on a signal output by the comparator circuitry, to an input of the integrator circuitry so as to generate a periodic signal at the output of the integrator circuitry.

The MEMS transducer test circuitry may be operable to: determine a parameter indicative of the frequency of the period signal; and estimate the capacitance between the first and second electrodes of the MEMS capacitive transducer based on the parameter indicative of the frequency of the period signal.

A sixth aspect of the invention provides a MEMS microphone comprising: a MEMS capacitive transducer comprising a first electrode and a second electrode; operational amplifier integrator circuitry comprising: an input signal terminal coupled to the second electrode of the MEMS capacitive transducer; an input reference terminal coupled to a reference voltage; and an output signal terminal coupled to the first electrode of the MEMS capacitive transducer, via a capacitor, such that a signal output by the output signal terminal is an integral of a current received at the input signal terminal, wherein the MEMS microphone further comprises comparison circuitry coupled between the output signal terminal and the input signal terminal for sinking current from and sourcing current to the input signal terminal in response to the signal at the output signal terminal, wherein the operational amplifier integrator circuitry and the comparison circuitry form a relaxation oscillator, a switching frequency of which is indicative of a capacitance value of the MEMS capacitive transducer.

A seventh aspect of the invention provides electronic apparatus comprising a system according to the first aspect, wherein the electronic apparatus comprises at least one of: a portable electronic device; a battery powered device; a computing device; a communications device; a gaming device; a mobile telephone; a media player; a laptop, tablet or notebook computing device; a wearable device; or a voice-activated or voice-controlled device.

BRIEF DESCRIPTION OF THE DRAWINGS

Embodiments of the invention will now be described, strictly by way of example only, with reference to the accompanying drawings, of which.

DETAILED DESCRIPTION

Figure 1:
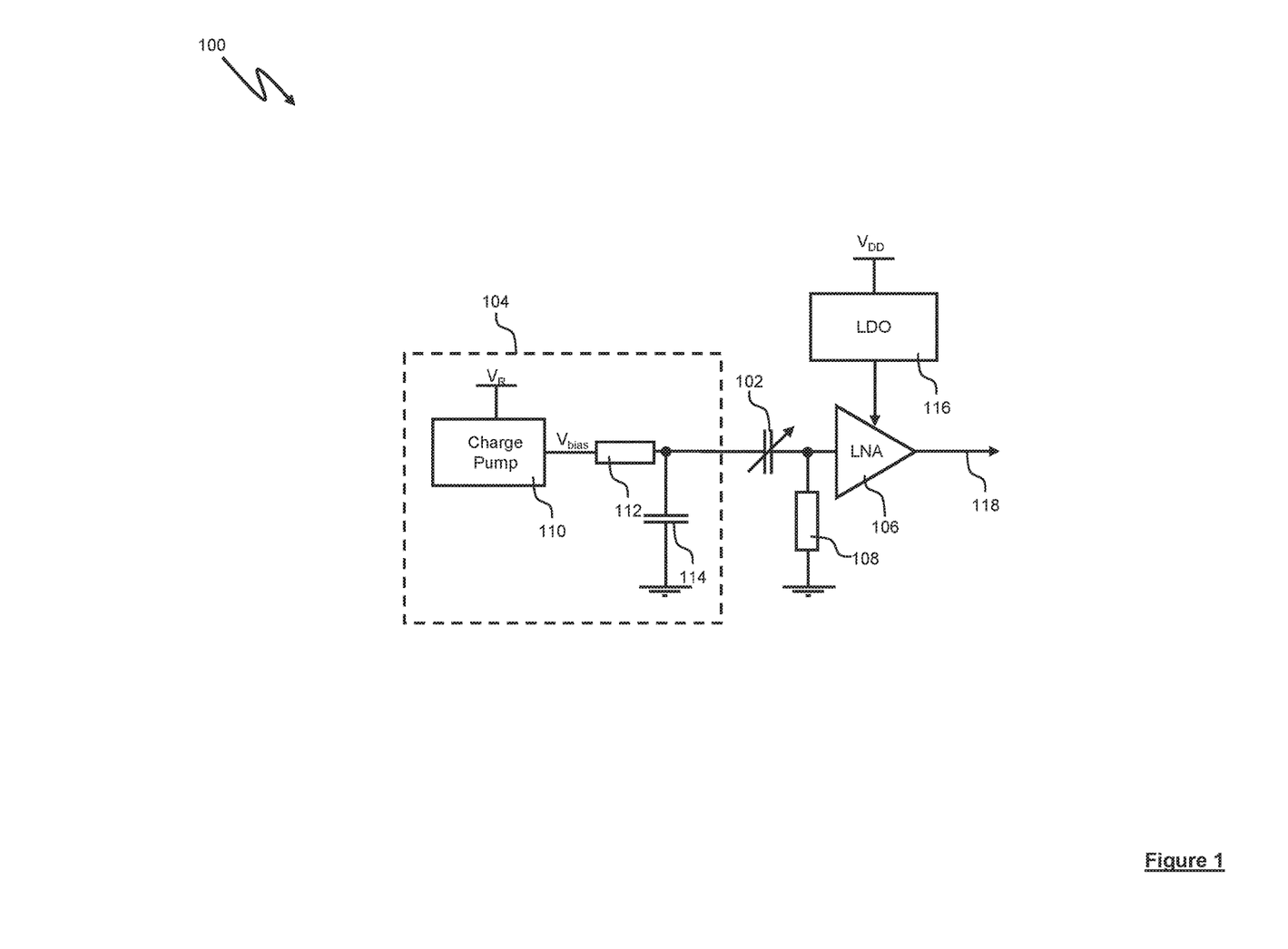
FIG. 1 is a schematic functional block diagram illustrating a MEMS transducer and associated circuitry.

Referring first to FIG. 1, MEMS transducer circuitry is shown generally at 100. The MEMS transducer circuitry 100 includes a MEMS transducer 102 (represented here as a variable capacitor), which in this example is operable as a microphone.

The MEMS transducer 102 comprises a first capacitive plate and a second capacitive plate (also referred to herein as electrodes). The first capacitive plate may be embedded within or otherwise attached to a flexible membrane, while the second capacitive plate may be embedded within or otherwise attached to a fixed backplate structure. In other examples, the first capacitive plate may be embedded within or otherwise attached to a fixed backplate structure, while the second capacitive plate may be embedded within or otherwise attached to a flexible membrane.

The MEMS transducer 102 may thus be configured such that an incoming pressure wave or sound wave causes displacement of the flexible membrane (and hence the associated first or second capacitive plate) relative to the fixed backplate structure (and hence the associated second or first capacitive plate).

The MEMS transducer 102 may comprise more than one plate embedded within or otherwise attached to the flexible membrane, and/or more than one capacitive plate embedded within or otherwise attached to the fixed backplate. Where the following description refers to a first capacitive plate and a second capacitive plate, therefore, it will be understood that such references also relate to a plurality of first capacitive plates and a plurality of second capacitive plates.

A first plate of the MEMS transducer 102 is arranged to receive a bias voltage $V_{bias}$, which is typically of the order of 12V, from biasing circuitry 104. A low-noise amplifier 106 has an input connected to the second plate of the MEMS transducer 102. This plate may also be connected to a high-value (typically of the order of 10 Gohm or greater) bias resistance 108 to bias this terminal to ground without shorting out the audio band signal. The bias resistance may be implemented in the form of polysilicon diodes.

The biasing circuitry 104 may comprise a charge pump 110 arranged to generate the required relatively high bias voltage $V_{bias}$ from a lower voltage input. Typically the charge pump 110 generates a bias voltage $V_{bias}$ which is equal to a multiple of the voltage applied to its input. It will be appreciated therefore that were the charge pump input connected directly to the voltage supply for an integrated circuit, then the bias voltage across the transducer would vary with the applied supply voltage. Also any noise on the supply would be similarly multiplied and would couple via the MEMS transducer 102 into the low noise amplifier 106, and would therefore be indistinguishable from any acoustically generated signals. Thus the voltage input for the charge pump 110 is preferably a supply-independent voltage $V_R$.

The reference voltage $V_R$ may be generated by a reference generator circuit (not illustrated) which will typically include a bandgap voltage reference generator. As will be understood by one skilled in the art a bandgap voltage reference generator can generate a reference voltage that is independent of variations of the supply voltage and which is also substantially temperature stable.

Nonetheless, the voltage output by the charge pump 110 may comprise an element of high-frequency noise. To attenuate this high-frequency noise, the biasing circuitry 104 may further comprise a low-pass filter made up of a resistor 112 coupled in series between the output of the charge pump 110 and the first plate of the MEMS transducer 102, and a capacitor 114 coupled between the first plate of the MEMS transducer 102 and a reference voltage such as ground. The resistor 112 may again comprise polysilicon diodes in order to achieve a suitably high impedance value. Those skilled in the art will appreciate that alternative filters may be provided. For example, the filter may comprise a low-pass filter (in the illustrated form or different) or a suitably configured band-pass filter. Where the MEMS transducer 102 is for use as a microphone the corner frequency of the low-pass filter may be below an audio frequency signal band to avoid signal-band components of noise.

The low-noise amplifier 106 is coupled to the second plate of the transducer 102, and thus receives the signal generated by the transducer 102 upon relative movement between the first and second plates of the transducer 102. The low-noise amplifier 106 may be supplied from a power source $V_{DD}$, via a low drop-out regulator 116. An amplified signal 118 is then output from the circuitry 100 for further processing as required.

The MEMS transducer circuitry 100 shown in FIG. 1 has a mechanism for measuring changes in capacitance of the transducer 102 (or for measuring changes in a variable that depends on the capacitance) as a result of incoming pressure waves and consequential movement of the plates relative to each other. However, the circuitry 100 has no mechanism for estimating the quiescent capacitance of the MEMS transducer 102, i.e. the capacitance of the MEMS transducer 102 when it is not subject to such incoming pressure waves.

Circuitry has been proposed for estimating the quiescent capacitance of the MEMS transducer 102, but the presence of parasitic or stray capacitances to ground (i.e. capacitances between nodes within the circuit and ground, e.g. between the input of the low-noise amplifier 106 and ground) in such circuitry can have a negative impact on the accuracy of the quiescent capacitance measurement produced by such circuitry.

Thus, a desire exists for a mechanism for estimating the quiescent capacitance of a MEMS transducer in which the accuracy of the quiescent capacitance measurement is not adversely affected by parasitic or stray capacitances to ground.

Figure 2:
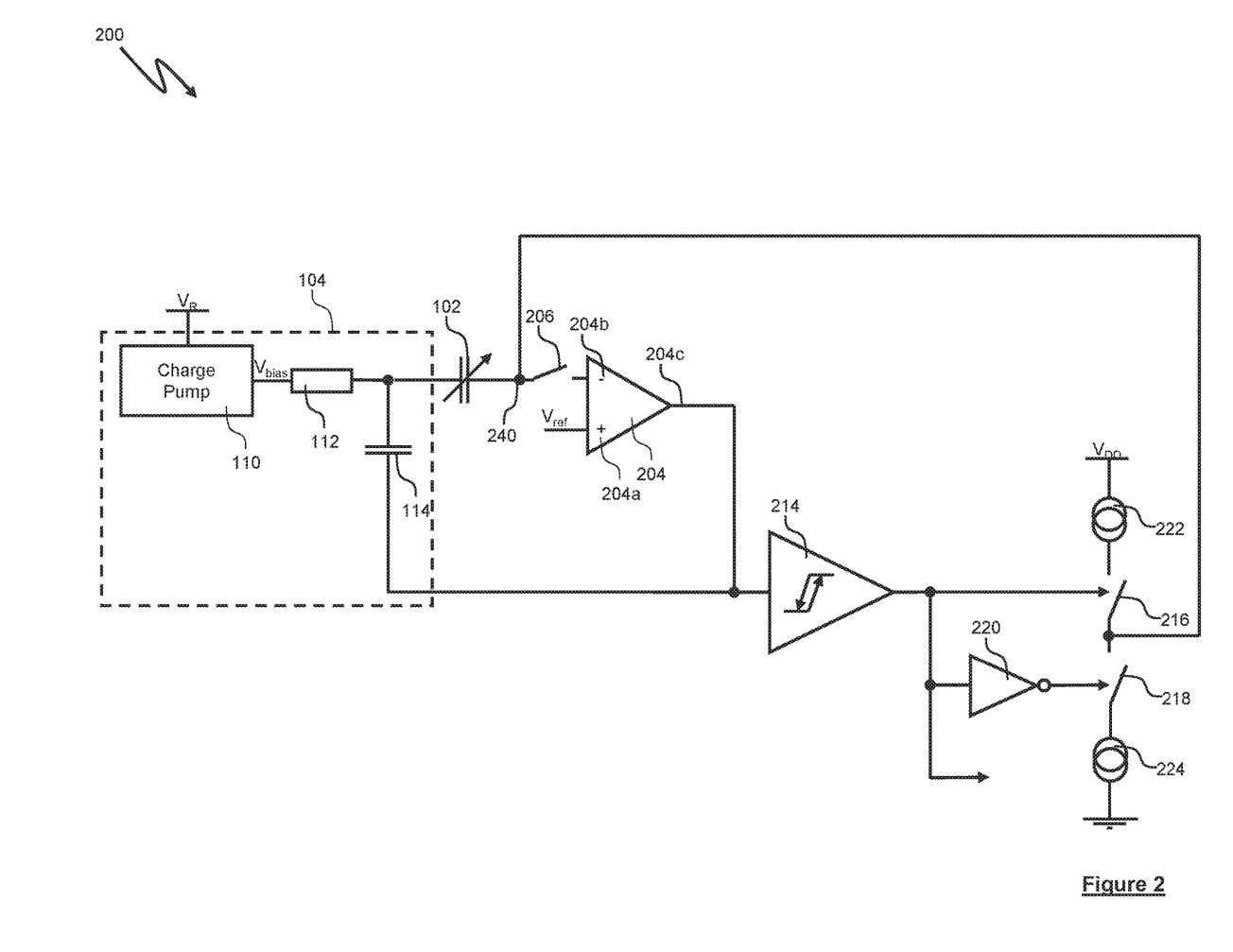
FIG. 2 is a schematic functional block diagram illustrating a MEMS transducer and associated circuitry that includes a mechanism for enabling the estimation of a quiescent capacitance of the MEMS transducer.

Referring now to FIG. 2, circuitry enabling the estimation of the quiescent capacitance of a MEMS capacitive transducer in a test mode is shown generally at 200. The circuitry 200 includes the MEMS capacitive transducer 102 and biasing circuitry 104, including charge pump 110, resistor 112 and capacitor 114, of the circuitry 100 of FIG. 1. The low-noise amplifier 106, resistor 108 and low drop-out regulator 116 of the circuitry 100 may also be present in the circuitry 200, but are not shown in FIG. 2 for reasons of clarity.

The circuitry 200 also includes an op-amp 204. In some examples, this op-amp may be used only for a test mode to measure or estimate the quiescent capacitance of the MEMS capacitive transducer 102, in which case it may be disconnected in a normal amplification (i.e. non-test) mode of operation, as illustrated by switch 206. In some examples suitable op-amp circuitry may already be connected to the second plate of the MEMS capacitive transducer 102, in which case switch 206 may be unnecessary. However in either case, further signal path configuration may be necessary by other switching arrangements in order to place the circuitry 200 in the test mode. Further, it is to be understood that FIG. 2 is a simplified representation that shows only a simple op-amp 204 for reasons of clarity. Those skilled in the art will appreciate that a practical circuit implementation of the principles described herein may also include other elements, for example buffers or series resistances, in signal paths to and from an actual op-amp circuit in order to implement what is referred to here as the op-amp 204. The circuitry 200 may also comprise other switching apparatus necessary to place circuitry 200 into the test mode, for instance to disconnect one node of capacitor 114 from ground and connect this node to an output of the op-amp 204.

In the example circuitry 200 of FIG. 2 a non-inverting input 204a of the op-amp 204 is coupled to a constant reference voltage $V_{ref}$, which may be equal to $V_{DD}/2$, for example (where $V_{DD}$ is a supply voltage of the circuitry 200), whilst an inverting input 204b of the op-amp 204 is coupled to an output 204c of the op-amp 204 by the series combination of the capacitor 114 and the MEMS transducer 102. Thus, the capacitor 114 and the MEMS transducer 102 form a negative feedback path between the output 204c of the op-amp 204 and the inverting input 204b of the op-amp 204, and the op-amp 204 is thus configured to implement an integrator, establishing a virtual earth at a circuit node 240 connected to the op-amp inverting input 204b.

The circuitry 200 further comprises comparator circuitry 214 coupled (directly or indirectly, e.g. via a buffer) to the output 204c of the op-amp 204, operable to compare the voltage at the output 204c of the op-amp 204 to one or more threshold voltages and to provide control signals for first and second switches 216, 218 based on the comparison. To this end, an output of the comparator circuitry 214 is coupled to the first switch 216, and the output of the comparator circuitry 214 is coupled to an input of an inverter 220, whose output is coupled to the second switch 218. Thus, the first switch 216 and the second switch 218 always adopt opposite states, i.e. when the first switch 216 is closed the second switch 218 is open, and vice versa. For example, when the comparator circuitry 214 outputs a logical low value the first switch 216 may be turned off (open) and the second switch 218 may be turned on (closed), whilst when the comparator circuitry 214 outputs a logical high value the first switch 216 may be turned on (closed) and the second switch 218 may be turned off (open).

The comparator circuitry 214 may be configured to compare the voltage at the output 204c of the op-amp 204 to an upper threshold voltage and a lower threshold voltage (which is lower than the upper threshold voltage), and to change the polarity of the control signals for the first and second switches 216, 218 when the voltage at the output 204c of the op-amp 204 reaches the upper threshold voltage and/or when the voltage at the output 204c of the op-amp 204 reaches the lower threshold voltage.

The comparator circuitry 214 may comprise a Schmitt trigger, which is a hysteretic comparator circuit designed to output a logical high value when a magnitude of an input signal is higher than a chosen upper threshold, and a logical low value when a magnitude of an input signal is lower than a chosen lower threshold (which is lower than the upper threshold). In between the two thresholds, the output of the circuit retains its value. However, alternative comparator circuit arrangements (e.g. a pair of separate comparator circuits with different threshold voltages and appropriate logic applied to combine their outputs) may be used to achieve the same result.

The first switch 216 is operable to couple a first current source 222 to the inverting input 204b (i.e. the virtual earth node 240) of the op-amp 204, while the second switch 218 is operable to couple a second current source 224 to the virtual earth node 240. The first and second current sources 222, 224 may be arranged such that one current source (in the illustrated example, the first current source 222) acts to source current into the virtual earth node 240 whereas the other current source (in the illustrated example, the second current source 224) acts to sink current out of the virtual earth node 240.

As used herein, the term "current source" covers any electronic circuit or component that provides a substantially constant current. Many different implementations will be known to those skilled in the art. For example, a current source may comprise a transistor operable to provide a current-stable output characteristic, or more than one transistor arranged as a current mirror. The current source may also comprise a resistance coupled to a voltage source (such as a supply voltage or a voltage based on a supply voltage). Since the virtual earth node 240 is maintained at the constant reference voltage $V_{ref}$ by the op-amp 204, a resistance coupled to a constant voltage source will apply a constant and well-defined current regardless of the op-amp output voltage. However an equivalent active current source will have a higher output impedance and thus give a current which is less sensitive to any variation or noise on the reference voltage $V_{ref}$. Further, it will be understood herein that the term "current source" covers both current sources and current sinks.

The first and second current sources 222, 224 may be selectively coupled to and uncoupled from the inverting input 204b of the op-amp 204 by the first and second switches 216, 218 such that the output 204c of the op-amp 204 swings between upper and lower voltages.

When the comparator output is a logic high level, the first switch 216 is closed and the second switch 218 is open, the first current source 222 is coupled to inject a constant current into the virtual earth node 240. To maintain the voltage on the virtual earth node 240, the op-amp 204 thus has to sink an equal constant current from this node, via the feedback path comprising the series combination of the capacitor 114 and MEMS capacitive transducer 102. Sinking this constant current through this capacitive path results in the voltage at the output 204c of the op-amp 204 ramping linearly in a negative-going direction as these capacitive components are supplied with this constant charging current.

While the voltage at the output 204c of the op-amp 204 remains greater than the lower threshold of the comparator circuitry 214 the comparator circuitry 214 continues to output a logical high signal, causing the first switch 216 to remain closed and the second switch 218 to remain open.

When the voltage at the output of the op-amp 204 eventually reaches the lower threshold of the comparator circuitry 214, the output of comparator circuitry 214 changes to output a logical low signal. This causes the second switch 218 to close and the first switch 216 to open, thereby coupling the second current source 224 to the virtual earth node 240, sinking current out of the virtual earth node 240.

To maintain the voltage on the virtual earth node 240, the op-amp 204 thus has to source an equal constant current into this node, via the feedback path comprising the series combination of the capacitor 114 and MEMS capacitive transducer 102. Sourcing this constant current through this capacitive path results in voltage at the output 204c of the op-amp 204 ramping linearly in a positive-going direction as these capacitive components are supplied with this constant charging current in the opposite direction than before.

While the voltage at the output 204c of the op-amp 204 remains less than the upper threshold of the comparator circuitry 214, the comparator circuitry 214 continues to output a logical low signal, causing the second switch 218 to remain closed and the first switch 216 to remain open.

When the voltage at the output of the op-amp 204 eventually rises to the upper threshold of the comparator circuitry 214, the comparator circuitry 214 changes to output a logical high signal. This causes the first switch 216 to close and the second switch 218 to open, thereby coupling the first current source 222 to the second plate of the MEMS transducer 102, to cause the second plate of the MEMS transducer 102 to begin charging again.

Thus in each direction the voltage on the second plate of the MEMS transducer 102 is maintained constant, while the voltage at the output 204c of the op-amp 204 ramps between a lower threshold $V_l$ and an upper threshold $V_h$, due to a current $I_{ref}$ charging a total effective feedback capacitance $C_{tot}$ (made up of the series combination of the capacitor 114 and the capacitance of the MEMS transducer 102, and stray capacitance, as will be described below).

The total charge $Q_{tot}$ supplied is equal to $$Q_{tot} = (V_h - V_l) C_{tot}.$$

The duration T of each ramp in the voltage at the output 204c of the op-amp 204 is equal to $$T = \frac{(V_{Hh} - V_l) C_{tot}}{I_{ref}}.$$

Thus, the combination of the op-amp 204, comparator circuitry 214, first and second switches 216, 218, inverter 220, current sources 222, 224, capacitor 114 and MEMS transducer 102 form a relaxation oscillator which outputs an oscillating signal whose frequency of oscillation $F_{out}$ is defined by the equation:

$$F_{out} = \frac{I_{ref}}{2(C_{tot}(V_h - V_l))}, \quad (1)$$

The total effective capacitance $C_{tot}$ in the negative feedback path of the op-amp 204 includes the capacitance $C_{BIAS}$ of the capacitor 114 and the capacitance $C_{MEMS}$ of the MEMS transducer 102.

The frequency $F_{out}$ of the oscillating signal output by the relaxation oscillator is not influenced by any stray capacitance from the virtual earth node 240 to any constant voltage, e.g. ground, because the virtual earth node 240 is maintained at a constant voltage.

Figure 3:
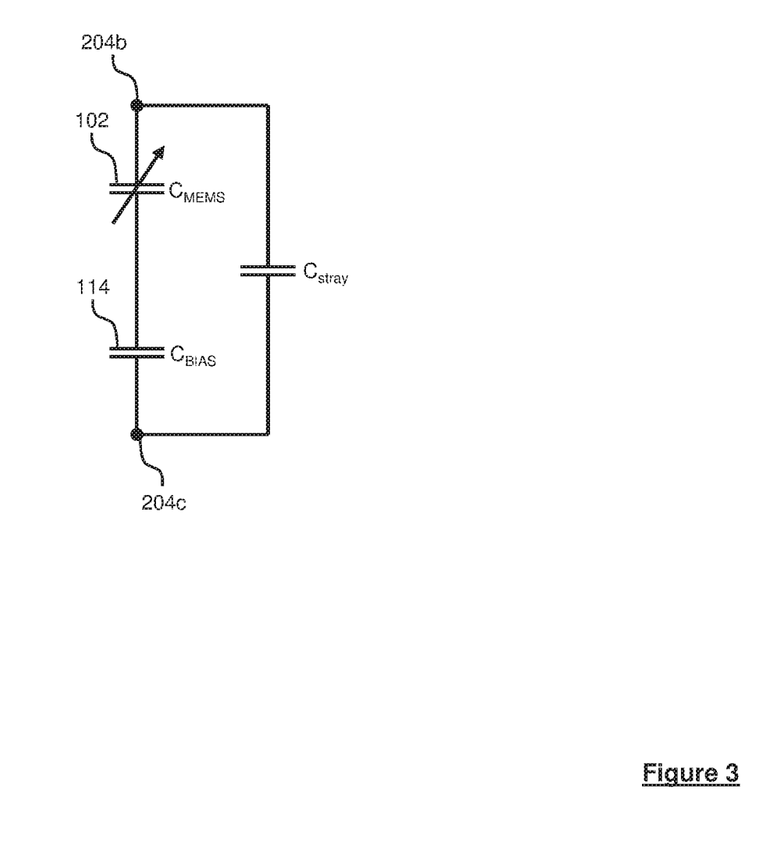
FIG. 3 is a schematic functional block diagram illustrating stray capacitance in a feedback loop of the circuitry of FIG. 2.

However, since the voltage on the output 204c of the op-amp 204 is not constant, the total effective capacitance $C_{tot}$ does have to take account of any stray capacitance that may be present between the output 204c of the op-amp 204 and the virtual earth node 240, which may arise due to physical proximity between pins or other connectors to the output and inverting input of the op-amp 204 in an integrated circuit or package in which the op-amp 204 is implemented. Thus, the total capacitance $C_{tot}$ in the negative feedback loop of the op-amp 204 may be represented as shown in FIG. 3, as a capacitance $C_{STRAY}$ representing stray capacitance between the output 204c of the op-amp 204 and the non-inverting input 204a of the op-amp 204 coupled in parallel with a series combination of the capacitance $C_{BIAS}$ of the capacitor 114 and the capacitance $C_{MEMS}$ of the MEMS transducer 102. The total effective capacitance $C_{tot}$ in the negative feedback path of the op-amp 204 may be calculated as:

$$C_{tot} = \left( C_{STRAY} + \frac{C_{MEMS} C_{BIAS}}{C_{MEMS} + C_{BIAS}} \right) \quad (2)$$

Thus, the frequency $F_{out}$ of the oscillating signal output by the relaxation oscillator is influenced not only by the quiescent capacitance of the MEMS transducer 102, but also by the capacitance $C_{BIAS}$ of the capacitor 114 and by the stray capacitance $C_{STRAY}$ between the output of the op-amp 204 and the non-inverting input of the op-amp 204.

To obtain an adequately low cut-off frequency, the capacitance $C_{BIAS}$ of the capacitor 114 is usually 10 to 100 times the value of $C_{MEMS}$, so any uncertainty in its value might not unduly alter the accuracy of the measurement. The stray capacitance $C_{STRAY}$ is between largely unrelated nodes of the circuitry and can usually be readily rendered small by appropriate layout of on-chip or on-board interconnections. This is in contrast to stray capacitances from terminals of the MEMS transducer 102 to ground, which are often inherent in the physical structure of the transducer elements or due to parasitics of essential components for bias or protection or monitoring the electrical output signal.

Thus, $C_{tot}$ may be determined from monitoring the output frequency $F_{out}$ and using Equation (1) with knowledge of the nominal values of $I_{ref}$, $V_h$ and $V_l$. $C_{MEMS}$ may then be deduced from Equation (2) using nominal values of $C_{BIAS}$ and $C_{STRAY}$. Since $C_{BIAS} \gg C_{MEMS}$ and $C_{STRAY} \ll C_{MEMS}$, these last two parameters will have relatively little effect.

To provide insensitivity to stray capacitances, the op-amp 204 needs to be designed with enough gain-bandwidth and slew rate to maintain the virtual earth node 240 at an accurate virtual earth. To measure a quiescent capacitance with reasonable resolution and test time an oscillation frequency of the order of 300 kHz, or in the range 100 kHz to 1 MHz is adequate and a suitable op-amp may be readily designed.

Those skilled in the art will appreciate that alternative configurations than those shown in FIG. 2 may be utilized to achieve substantially the same result. For example, in one alternative configuration, a single floating current source may be utilized to charge and discharge the MEMS transducer 102, by altering the polarity of the connection between the current source and the second terminal of the MEMS transducer 102 instead of coupling and uncoupling multiple current sources.

The circuitry 200 may be embodied in a single integrated circuit, which may itself form part of a larger system such as a portable electronic device.

Additionally, part of the circuitry 200 may be provided as MEMS transducer amplifier circuitry or dedicated MEMS transducer test circuitry, for example in a dedicated integrated circuit that may be included together with a MEMS transducer in a larger system or device, or may be provided at a MEMS transducer test station or facility. For example, MEMS transducer amplifier or test circuitry may include all of the components of the circuitry 200 of FIG. 2 except the charge pump 110, resistor 112 and MEMS capacitive transducer 102, with terminals being provided in the MEMS transducer test circuitry for coupling the first and second electrode of a MEMS capacitive transducer to the capacitor 114 and the virtual earth node 240 respectively.

Figure 4:
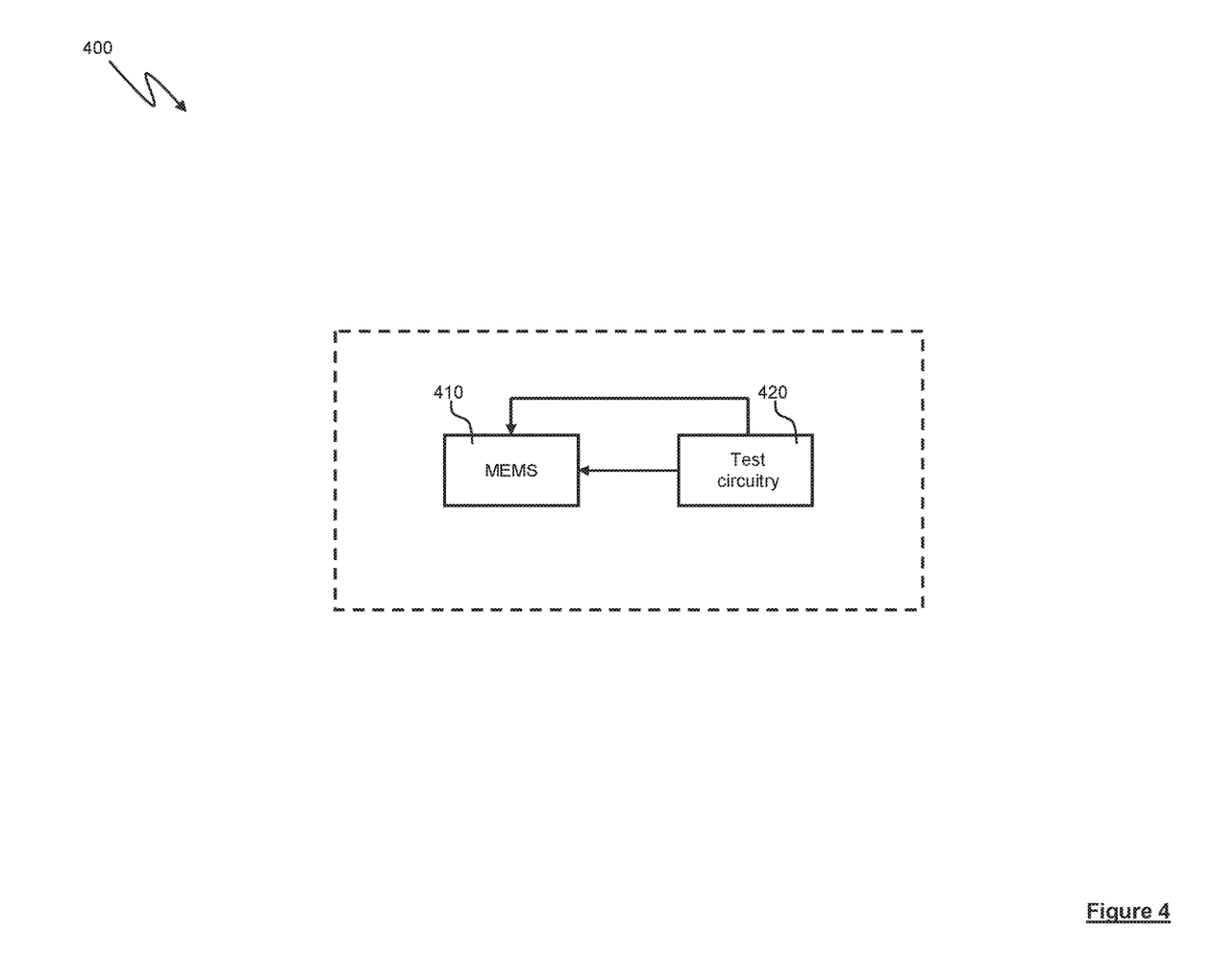
FIG. 4 is a schematic functional block diagram illustrating a MEMS transducer system.

FIG. 4 is a schematic representation of a MEMS capacitive transducer system for estimating the capacitance value of a MEMS transducer. The capacitive transducer system, shown generally at 400, includes MEMS transducer circuitry 410, which may be, for example, the MEMS transducer circuitry 200 or part of the MEMS transducer circuitry 200 described above with reference to FIG. 2, and test circuitry 420, which may include part of the MEMS transducer circuitry 200 described above with reference to FIG. 2. For example, the MEMS transducer circuitry 410 may include the MEMS capacitive transducer 102, charge pump 110, resistor 112 and op-amp circuitry 204 which may be provided in a single integrated circuit, whilst the test circuitry 420 may include the op-amp circuitry 204 (if this is not provided as part of the MEMS transducer circuitry 410), comparator 214, switches 216, 218, inverter 220 and current sources 222, 224. The test circuitry 420 may further include processing circuitry for estimating a capacitance value of the MEMS capacitive transducer based on the output frequency $F_{out}$ or a parameter indicative of the output frequency $F_{out}$.

The test circuitry 420 is communicatively coupled to the MEMS transducer circuitry 410, and is operable to receive one or more signals from the MEMS transducer circuitry 410, such as the control signals generated by the comparator circuitry 214 (or buffered versions of those control signals) or the output signal generated by the op-amp 204.

The system 400 may be embodied within a single integrated circuit, i.e. both the MEMS transducer circuitry 410 and the test circuitry 420 may be embodied on the same integrated circuit, or chip. Alternatively, the system 400 may be embodied on multiple integrated circuits within the same host device (e.g. a phone, laptop or other macro electronic device). That is, the MEMS transducer circuitry 410 may be embodied on a first integrated circuit (or multiple integrated circuits), while the test circuitry 420 is embodied on a second integrated circuit that is coupled to the first integrated circuit. In either case, such arrangements allow the capacitance of the MEMS transducer 102 to be estimated upon manufacture and also during use, i.e. once the MEMS system 400 has been placed in an electronic device and the electronic device sold to a user. In further alternatives, some or all of the test circuitry 420 may be embodied in external circuitry that does not form part of the same integrated circuit as the MEMS transducer circuitry 410, or even the same device. For example, the test circuitry 420 may be provided at a manufacturing or test facility, and coupled to multiple MEMS transducer circuits in sequence, or as part of a manufacturing line, in order to measure the capacitance of each transducer that is manufactured or at least of a representative number of samples.

As noted above, the frequency $F_{out}$ of the oscillating signal output by the relaxation oscillator is influenced by the quiescent capacitance of the MEMS transducer 102, the capacitance of the capacitor 114 and the stray capacitance between the output 204c of the op-amp 204 and the inverting input 204b of the op-amp 204. The test circuitry 420 is operable to estimate the frequency $F_{out}$, or a parameter that is indicative of the frequency $F_{out}$, such as a period (duration) of a cycle in which the voltage at the output of the op-amp 204 rises from the lower threshold voltage to the upper threshold and then falls from the upper threshold voltage to the lower threshold voltage, or a period (duration) of a cycle in which the control signal output by the comparator circuitry 214 first changes from a logical low to a logical high and then from a logical high to a logical low. In some examples, the parameter that is indicative of the frequency $F_{out}$ is a portion of a complete cycle, for instance the time taken for the voltage at the output of the op-amp 204 to rise from the lower threshold voltage to the upper threshold or vice versa, possibly via a dependent control signal.

The test circuitry 420 may comprise automated test equipment, which can determine the frequency $F_{out}$ directly. This arrangement may be particularly suited to embodiments in which the test circuitry 420 is implemented in circuitry that is external to the MEMS transducer circuitry 410.

Alternatively, the test circuitry may be configured to determine a parameter such as a charge-discharge cycle period of the MEMS transducer 102, a cycle period of the signal output by the op-amp 204, or a period of the control signal output by the comparator circuitry 214. For example, the test circuitry 420 may comprise a counter that is coupled to receive a clock signal having a frequency that is much higher than expected frequency $F_{out}$ of the oscillating signal output by the relaxation oscillator. The counter increments at the rate of the clock signal, and so counts the number of clock cycles in each charge-discharge cycle or op-amp output cycle (so determining the period), or the number of clock cycles between a change in output of the comparator circuitry 214 (so determining half the period). This arrangement may be particularly suited to embodiments in which the MEMS system 400 is embodied within an electronic device or on a single integrated circuit. Alternatively, the number of charge-discharge cycles or op-amp output cycles in a given period (sufficiently long to cover multiple cycles) may be counted and the average cycle period calculated.

The test circuitry 420 may be further operable to provide one or more control signals to the MEMS transducer circuitry 410, either directly or via one or more intermediate components such as processing circuitry and memory. For example, the test circuitry 420 may be operable to place the MEMS transducer circuitry 410 into a test mode, in which the current sources 222, 224 are coupled to the second plate of the MEMS transducer 102 in order to estimate the quiescent capacitance of the MEMS transducer 102. Thus the test circuitry 420 may generate control signals for one or more of: instructing the biasing circuitry 104 to generate biasing voltages for the MEMS transducer 102; coupling the comparator circuitry 214 to the output of the op-amp 204 so as to initiate the charge-discharge cycle; and de-coupling the output of the op-amp 204 from audio processing circuitry so as to prevent any audio signals resulting from the test process from reaching the user.

The test circuitry 420 may further alter the biasing voltage generated by the biasing circuitry 104 based on the estimated capacitance, e.g. so as to achieve a given output signal for a given input pressure or sound wave. For example, if the capacitance is estimated to be lower than some expected value (e.g. due to degradation of the MEMS transducer 102 over time, or a minor defect in the manufacturing process, etc.), the biasing voltage can be increased by a factor or some absolute amount to compensate for the lower capacitance so as to achieve a consistent output for a given input pressure or sound wave. Similarly, if the estimated capacitance is higher than the expected value, the biasing voltage can be decreased to compensate and so achieve a consistent output signal.

Alternatively, the test circuitry 420 may alter the gain of a low-noise amplifier (e.g. the low-noise amplifier 106 of FIG. 1 or some other amplifier circuitry) so as to compensate for the capacitance of the MEMS transducer 102 and ensure a consistent output for a given input pressure or sound wave.

The test circuitry 420 may estimate the capacitance of the MEMS transducer 102 in a number of different ways. For example, if values are known for the current $I_{ref}$ in the current sources 222, 224 and the upper and lower voltage thresholds $V_h$ and $V_l$, a measured or derived value for the period $F_{out}$ can be used to estimate the total capacitance $C_{tot}$ in the negative feedback loop of the op-amp 204. If the value of the capacitor 114 is known then the total capacitance of the MEMS transducer 102 and the stray capacitance $C_{STRAY}$ can be estimated by using equation 2 above. The estimated total capacitance of the MEMS transducer 102 and the stray capacitance $C_{STRAY}$ can be compared to an expected quiescent capacitance value of the MEMS transducer 102, and the test circuitry 420 may compensate for any difference between the expected quiescent capacitance value for the MEMS transducer 102 and the estimated total capacitance of the MEMS transducer 102 and the stray capacitance $C_{STRAY}$ by adjusting the bias voltage $V_{bias}$ output by the charge pump 208 or the gain of an amplifier as discussed above.

Figure 5:
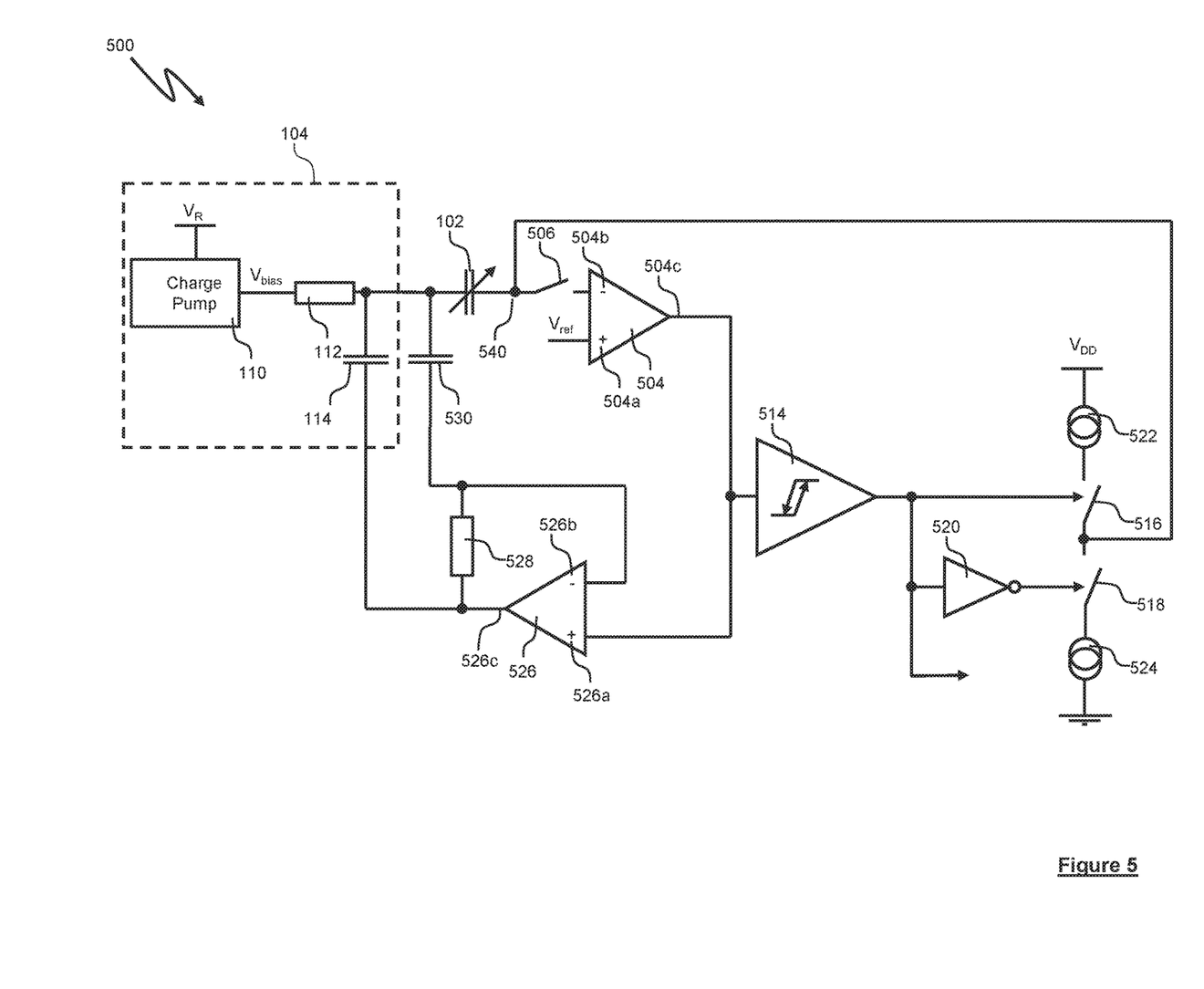
FIG. 5 is a schematic functional block diagram illustrating alternative MEMS transducer circuitry that includes a mechanism for enabling the estimation of a quiescent capacitance of the MEMS transducer.

Referring now to FIG. 5, alternative circuitry enabling the estimation of the quiescent capacitance of a MEMS transducer in a test mode is shown generally at 500. The circuitry 500 is similar to the circuitry 200 of FIG. 2, and includes additional components to negate the effect of the capacitor 114 of the circuitry 200 of FIG. 2 on the frequency of the oscillating signal output by the relaxation oscillator, as will be described below.

The circuitry 500 includes the MEMS capacitive transducer 102, biasing circuitry 104 including charge pump 110, resistor 112 and capacitor 114 of the circuitry 100 of FIG. 1. The low-noise amplifier 106, resistor 108 and low drop-out regulator 116 of the circuitry 100 may also be present in the circuitry 500, but are not shown in FIG. 5 for reasons of clarity.

The circuitry 500 includes a first op-amp 504, illustrative switch 506, comparator circuitry 514, inverter 520, first switch 516, second switch 518, first current source 522, and second current source 524, connected and operative in a similar manner to respective similarly numbered components of the circuitry 200 of FIG. 2, namely first op-amp 204, illustrative switch 206, comparator circuitry 214, inverter 220, first switch 216, second switch 218, first current source 522 and second current source 224.

In the circuitry 500 of FIG. 5, a feedback path from the output 504c of first op-amp 504 comprises the capacitor 114 and MEMS transducer 102. The feedback path also comprises a second op-amp 526, a feedback capacitor 530 and a feedback resistor 528.

The second op-amp 526, feedback resistor 528 and feedback capacitor 530 together form an AC follower. A non-inverting input 526a of the second op-amp 526 is coupled to the output 504c of the first op-amp 504. The feedback capacitor 530 is coupled between the first plate of the MEMS transducer 502 and an inverting input 526b of the second op-amp 526, whilst the feedback resistor 528 is coupled between an output 526c of the second op-amp and the inverting input 526b of the second op-amp 526.

The second op-amp 526 has an AC feedback path comprising a series combination of capacitor 114 and feedback capacitor 530. In operation, the second op-amp 526 forces the voltage at its inverting input 526b to follow the oscillatory ramp waveform it receives at its non-inverting input 526a from the output 504c of the first op-amp 504. The resistor 528 has a high resistance value, such that the time constant of the feedback capacitor 530 and the feedback resistor 528 corresponds to frequencies well below the expected oscillation frequency, so the voltage drop across capacitor 530 does not change. Accordingly, the AC waveform at the first plate of the MEMS transducer 102 also follows the output waveform of the first op-amp 504. Thus, as far as the operation of the first op-amp 504 is concerned, the AC feedback path is equivalent to a direct connection of the MEMS transducer 102 from the output 504c of the first op-amp 504 to the virtual earth node 540.

The effect of the AC follower formed by the second op-amp 526, feedback resistor 528 and feedback capacitor 530 is to negate any effect of the capacitor 114 on the frequency of the oscillating signal output by the relaxation oscillator, which simplifies the estimation of the total capacitance in the feedback loop of the first op-amp 504, since the capacitor 114 can be ignored. Equation 1 still applies, i.e.

$$F_{out} = \frac{I_{ref}}{2(C_{tot}(V_h - V_l))},$$

but now the total capacitance $C_{tot}$ can be evaluated as:

$$C_{tot} = (C_{STRAY} + C_{MEMS}). \qquad (3)$$

The oscillation frequency is still sensitive to $C_{STRAY}$, but is now advantageously insensitive to $C_{BIAS}$. It is also insensitive to any parasitic capacitances from the first plate of the MEMS transducer 102 to ground. Additionally, as with the circuitry 200 of FIG. 2, the oscillation frequency is insensitive to parasitic capacitances from the virtual earth node 540 to other constant voltage nodes.

The circuitry 500 of FIG. 5 may be used in the MEMS capacitive transducer system 400 in a manner similar to that described above in relation to the use of the circuitry 200 in the system 400.

Figure 6:
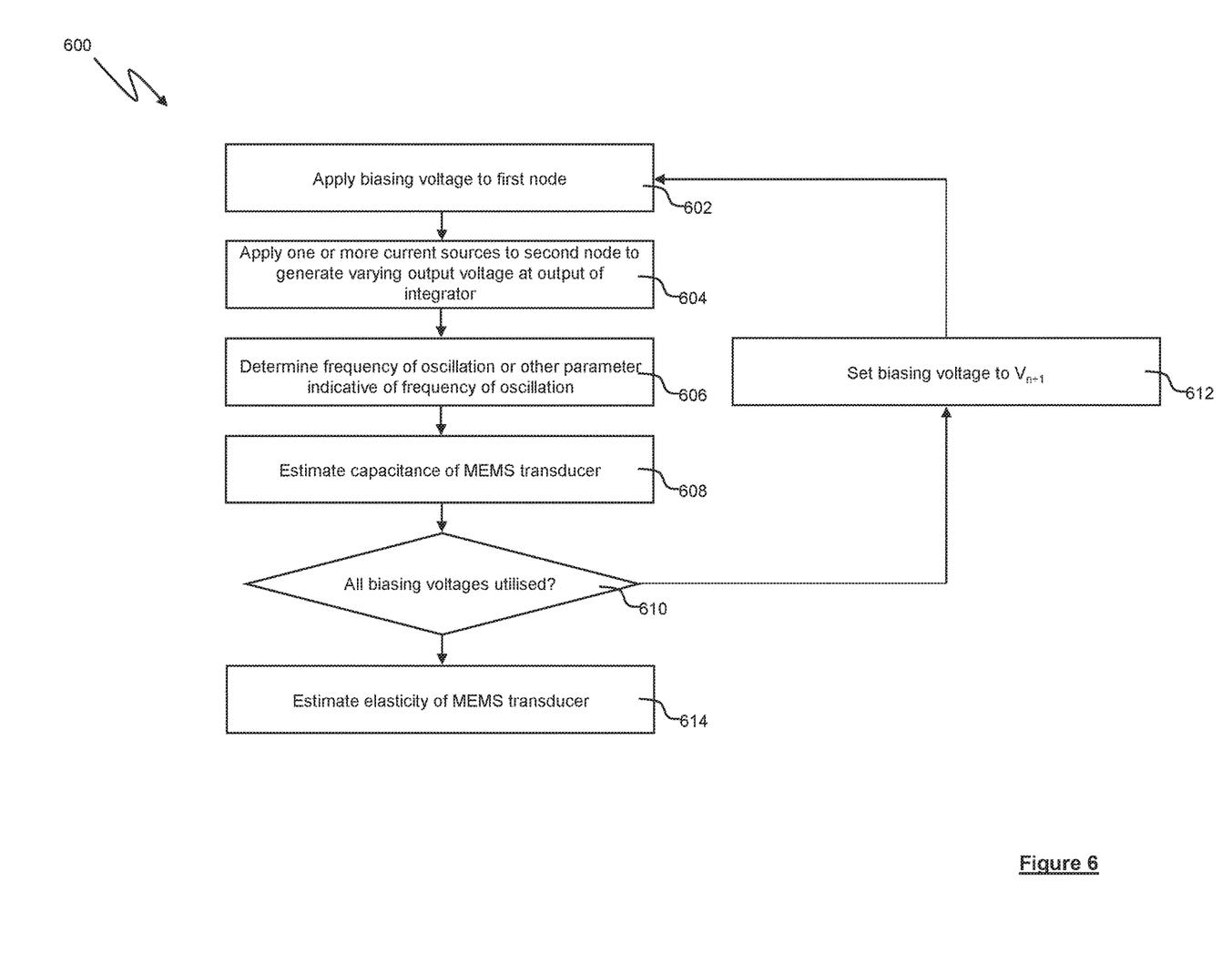
FIG. 6 is a flow diagram illustrating steps in a method that may be performed by the circuitry of FIG. 2 or 5 or by the system of FIG. 4.

FIG. 6 is a flow chart illustrating steps in a method 600 for estimating the capacitance of a MEMS transducer. The method may be performed in the MEMS transducer circuitry 200, 500 and more generally in the MEMS transducer system 400. The method may be implemented as part of the process of manufacturing the MEMS transducer circuitry 200, 500 or during use of the MEMS transducer circuitry 200, 500 in an electronic device (e.g. upon power up of the device).

In step 602, a test or calibration mode is entered, and a biasing voltage is generated by the biasing circuitry 104 and applied to a first node (which is connected to a first plate of the MEMS transducer 102). A second node (which is connected to a second plate of the MEMS transducer 102) is configured to couple to an input of the op-amp 204, 504) and an appropriate feedback path is established, comprising the bias capacitor 114 and both plates of the MEMS transducer 102.

In step 604, one or more current sources are applied to the second node in order to generate an output voltage at the output of the integrator circuitry which varies between upper and lower threshold voltages. Thus one or more current sources 222, 224, 522, 524 are switched so as to be applied to the second node until the output of the integrator circuitry reaches the upper threshold voltage and, upon reaching the threshold, the one or more current sources are switched so as to be applied to the second node until the output of the integrator circuitry reaches the lower threshold voltage (or vice versa). This process may be repeated multiple times, such that an oscillation is established in the signal that is output from the integrator circuitry.

In step 606, the frequency of the oscillation (or a parameter that is indicative of the frequency of the oscillation, such as a time period or part of a time period of the transducer charge-discharge cycle or the op-amp output cycle) is determined. For example, the parameter may be determined based on the signal that is output from the transducer 102, 502 or the op-amp 204, 504, or based on control signals that control the switching of the one or more current sources 222, 224, 522, 524.

In step 608, based on the measured parameter indicative of the frequency of oscillation, the capacitance of the MEMS transducer 102, 502 is estimated. For example, the capacitance may be determined based additionally on known values of the current flowing in the current source(s) 222, 224, 522, 524 and the upper and lower threshold voltages.

The method may end at step 608. However, it will be appreciated that the value of the biasing voltage will in general have an effect on the measured capacitance. That is, the biasing voltage that is applied to the first plate of the MEMS transducer 102,502 may generate an electrostatic force between the plates of the transducer and thus effectively alter the "rest" position of the MEMS transducer 102 (i.e. the distance between the first and second plates, or the position of the moveable plate with respect to the fixed plate) in the absence of incoming pressure or sound waves. The distance between the plates affects the capacitance of the MEMS transducer 102,502 (as the capacitance is inversely proportional to the distance between the plates), and therefore the biasing voltage that is applied in step 602 also affects the capacitance of the MEMS transducer 102,502.

Thus, steps 602, 604, 606 and 608 may be repeated for multiple different values of the biasing voltage.

In step 610, the test circuitry determines whether the capacitance of the MEMS transducer 102 has been determined for all desired biasing voltages. If not, the method proceeds to step 612 and the biasing voltage is set to a different value (e.g., if the previous value of the biasing voltage is $V_n$, the next value may be $V_{n+1}$). The method then repeats steps 602, 604, 606 and 608 to estimate the capacitance of the MEMS transducer 102 for the biasing voltage $V_{n+1}$.

The multiple biasing voltages may be set within a range of values that includes the normal operating voltage of the MEMS transducer 102, i.e. the biasing voltages may be set between a lower value (e.g. 1 V or even 0 V) and an upper value (e.g. 20 V), with the normal operating voltage expected to be 12 V or similar. The biasing voltages may be substantially equally spaced across the range. However, at higher biasing voltages the electrostatic forces between the plates of the MEMS transducer 102 begin to dominate the interaction of the plates, causing significant variation of the capacitance. Thus at higher voltages the steps between consecutive biasing voltages may be smaller than the steps at lower voltages. That is, in a first, lower range of biasing voltages (e.g. 0 V to 17 V) the steps between the applied biasing voltages may be set to a first value (e.g. 2 V); in a second, higher range of biasing voltages (e.g. 17 V to 20 V) the steps between the applied biasing voltages may be set to a second, smaller value (e.g. 0.5 V). At these higher voltages, the changes in capacitance of the MEMS transducer 102 with biasing voltage can thus be measured more closely.

The different values of capacitance for different biasing voltages can be used in a number of different ways. In one embodiment, the values are used to determine an appropriate biasing voltage to be applied to the first node of the MEMS transducer 102 during use. That is, the biasing voltage that achieves a desired capacitance value can be selected as the biasing voltage to be used in further use of the MEMS transducer 102.

In another embodiment, the values may be used in step 614 to determine an elasticity of the MEMS transducer 102 (i.e. an elasticity of the moveable membrane). That is, the capacitance of the MEMS transducer 102 is measured at a plurality of different voltages, while the membrane is stationary. At such an equilibrium, the elastic restorative force (which acts to restore the membrane to its resting position in the absence of biasing voltage) is equal and opposite to the electrostatic force arising from the biasing voltage, attracting the plates of the transducer towards each other. The elastic restorative force may be given by an elasticity constant multiplied by the displacement of the membrane from its resting position. By measuring the capacitance of the MEMS transducer 102 at multiple biasing voltages, the elasticity of the membrane may be extracted via numerical or graph-fitting methods based on an electromechanical model of the transducer. The determined elasticity may then be utilized to alter the biasing voltage of the MEMS transducer 102 circuitry 100 during normal operation, or the gain of the low-noise amplifier 106, so as to compensate for changes in the elasticity of the membrane over time.

Embodiments of the present disclosure provide methods and apparatus for estimating the capacitance of a MEMS transducer. The methods can be applied as part of the manufacturing process, or later during use of the MEMS transducer in an electronic device. The estimated value of the capacitance can be used to calibrate the MEMS transducer circuitry so as to achieve a given output signal for a given input pressure or sound wave.

The disclosed techniques have particular advantages for integrated MEMS transducers (i.e. where MEMS transducers are integrated on the same circuit as companion electronic circuitry such as biasing circuitry, amplifying circuitry, etc). In such systems it is otherwise difficult to measure the transducer capacitance, as an additional bond to one of the transducer plates (from which the capacitance may be measured) would add significant parasitic capacitance to that node.

Additionally, the disclosed techniques are advantageous where a MEMS transducer is implemented on a separate semiconductor die to the companion electronic circuitry. The connections, for example bond wire and associated pads and/or conductive tracks on a circuit board substrate, are likely to introduce significant stray capacitances to ground, to which the described method is insensitive.

Embodiments may be implemented in a range of applications and in particular are suitable for audio applications.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as notebook, laptop or tablet computing device. The device could be a gaming device. The device could be a wearable device such as a smartwatch. The device could be a device with voice control or activation functionality. In some instances the device could be an accessory device such as a headset or the like to be used with some other product.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A capacitance measurement system for estimating a quiescent capacitance of a MEMS capacitive transducer comprising:
    a MEMS capacitive transducer comprising a first electrode and a second electrode;
        integrator circuitry; and
        test circuitry,
    wherein the MEMS capacitive transducer forms part of a negative feedback path of the integrator circuitry,
    and wherein the test circuitry is operable to:
        selectively apply one or more current sources to an input of the integrator circuitry based on a signal at an output of the integrator so as to generate a periodic signal at the output of the integrator circuitry, wherein a frequency of the periodic signal is at least partially dependent upon the quiescent capacitance of the MEMS capacitive transducer;
        determine a parameter indicative of the frequency of the periodic signal; and
        estimate the quiescent capacitance of the MEMS capacitive transducer based on the parameter indicative of the frequency of the periodic signal.

2. A capacitance measurement system according to claim 1 wherein the test circuitry comprises comparator circuitry operable to compare a voltage of the periodic signal output by the integrator circuitry to an upper reference voltage and to a lower reference voltage, wherein the test circuitry is operable to selectively apply the one or more current sources to the input of the integrator circuitry based on the result of the comparison.

3. A capacitance measurement system according to claim 2 wherein the comparator circuitry comprises a Schmitt trigger.

4. A capacitance measurement system according to claim 1 wherein the integrator circuitry comprises first operational amplifier circuitry.

5. A capacitance measurement system according to claim 1 further comprising:
    a first capacitor coupled between an output of the integrator circuitry and the first electrode of the MEMS capacitive transducer such that the negative feedback path of the integrator circuitry contains a series combination of the first capacitor and the MEMS capacitive transducer.

6. A capacitance measurement system according to claim 5, further comprising an AC follower in the negative feedback path of the integrator circuitry, the AC follower comprising:
    second operational amplifier circuitry having a first input coupled to the output of the integrator circuitry;
    a second capacitor coupled between the first electrode of the MEMS capacitive transducer and a second input of the second operational amplifier circuitry;
    a resistor coupled between an output of the second operational amplifier circuitry and the second input of the second operational amplifier circuitry,
    wherein the first capacitor is coupled between the output of the second operational amplifier circuitry and the first electrode of the MEMS capacitive transducer.

7. A capacitance measurement system according to claim 1 wherein the test circuitry is operable to selectively apply the one or more current sources to the input of the integrator circuitry by alternately switching the one or more current sources between a pull-up configuration and a pull-down configuration.

8. A capacitance measurement system according to claim 1 further comprising controller circuitry operable to adjust a bias voltage applied to the MEMS capacitive transducer based on the estimated capacitance of the MEMS capacitive transducer so as to achieve a given response of the MEMS capacitive transducer to acoustic inputs or driving voltages.

9. A capacitance measurement system according to claim 1 wherein the parameter indicative of the frequency of the periodic signal comprises:
    the frequency of the periodic signal; or
    a time period or part of the time period of the periodic signal.

10. A capacitance measurement system according to claim 2 wherein the parameter indicative of the frequency of the periodic signal comprises:
    a frequency of a signal output by the comparator circuitry; or
    a time period or part of the time period of the signal output by the comparator circuitry.

11. A capacitance measurement system according to claim 1 wherein the system is implemented on a single integrated circuit.

12. A method for estimating a quiescent capacitance of a MEMS capacitive transducer comprising a first electrode and a second electrode, wherein the MEMS capacitive transducer forms part of a negative feedback path of integrator circuitry, the method comprising:
    selectively applying one or more current sources to an input of the integrator circuitry based on a signal at an output of the integrator circuitry so as to generate a periodic signal at the output of the integrator circuitry, wherein a frequency of the periodic signal is at least partially dependent upon the quiescent capacitance of the MEMS capacitive transducer;

determining a parameter indicative of the frequency of the periodic signal; and estimating the quiescent capacitance of the MEMS capacitive transducer based on the parameter indicative of the frequency of the periodic signal.

13. A method according to claim 12 further comprising:

comparing a voltage of the periodic signal at the output of the integrator circuitry to an upper reference voltage and to a lower reference voltage using comparator circuitry;

selectively applying the one or more current sources to the input of the integrator circuitry based on the result of the comparison.

14. A method according to claim 12 further comprising selectively applying the one or more current sources to the input of the integrator circuitry by alternately switching the one or more current sources between a pull-up configuration and a pull-down configuration.

15. A method according to claim 12 further comprising adjusting a bias voltage applied to the MEMS capacitive transducer based on the estimated capacitance of the MEMS capacitive transducer so as to achieve a given response of the MEMS capacitive transducer to acoustic inputs or driving voltages.

16. A method according to claim 12 wherein the parameter indicative of the frequency of the periodic signal comprises:

the frequency of the periodic signal; or a time period or part of the time period of the periodic signal; or a time period or part of the time period of the signal output by the comparator circuitry.

17. A method according to claim 12, wherein the method further comprises:

for each of a plurality of different bias voltages:
applying a selected bias voltage of the plurality of bias voltages to the first electrode of the MEMS capacitive transducer; and estimating the capacitance of the MEMS capacitive transducer when the selected bias voltage is applied; and estimating an elasticity of the MEMS capacitive transducer using the estimated capacitances for each of the plurality of different bias voltages based on an electromechanical model of the MEMS capacitive transducer.

18. MEMS transducer test circuitry for estimating a quiescent capacitance of a MEMS capacitive transducer, the test circuitry comprising:

oscillator circuitry for generating a periodic signal indicative of a quiescent capacitance between first and second electrodes of the MEMS capacitive transducer, the oscillator circuitry comprising:

integrator circuitry, wherein the first and second electrodes of the MEMS capacitive transducer can be connected to form part of a first negative feedback loop of the integrator circuitry;

comparator circuitry for monitoring an output of the integrator circuitry; and one or more current sources selectively applicable, based on a signal output by the comparator circuitry, to an input of the integrator circuitry so as to generate a periodic signal at the output of the integrator circuitry.

19. MEMS transducer test circuitry according to claim 18 operable to:

determine a parameter indicative of the frequency of the period signal; and estimate the quiescent capacitance between the first and second electrodes of the MEMS capacitive transducer based on the parameter indicative of the frequency of the period signal.

20. An electronic apparatus comprising a system according to claim 1, wherein the electronic apparatus comprises at least one of: a portable electronic device; a battery powered device; a computing device; a communications device; a gaming device; a mobile telephone; a media player; a laptop, tablet or notebook computing device; a wearable device; or a voice-activated or voice-controlled device.

* * * * *